(12) United States Patent
Kenny et al.

(10) Patent No.: US 6,599,758 B2
(45) Date of Patent: *Jul. 29, 2003

(54) POST-EPITAXIAL THERMAL OXIDATION FOR REDUCING MICROSTEPS ON POLISHED SEMICONDUCTOR WAFERS

(75) Inventors: Danny Kenny, Sherman, TX (US); Keith Lindberg, Sherman, TX (US)

(73) Assignee: MOS EPI, Inc., Sherman, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/222,112

(22) Filed: Aug. 16, 2002

(65) Prior Publication Data

US 2002/0192844 A1 Dec. 19, 2002

Related U.S. Application Data

(60) Continuation of application No. 10/114,899, filed on Apr. 2, 2002, now Pat. No. 6,482,659, which is a division of application No. 09/233,253, filed on Jan. 19, 1999, now Pat. No. 6,372,521.
(60) Provisional application No. 60/072,046, filed on Jan. 21, 1998.

(51) Int. Cl.$^7$ ............................................... H01L 21/00
(52) U.S. Cl. ........................... 438/4; 438/478; 438/481; 438/977; 438/974
(58) Field of Search ........................... 438/4, 478, 481, 438/974, 977

(56) References Cited

U.S. PATENT DOCUMENTS

| | | | | |
|---|---|---|---|---|
| 4,615,762 A | * | 10/1986 | Jastrzebski et al. | ......... 438/412 |
| 6,240,933 B1 | * | 6/2001 | Bergman | .................... 134/1.3 |
| 6,312,968 B1 | * | 11/2001 | Shimabukuro et al. | ....... 438/30 |

* cited by examiner

*Primary Examiner*—Richard Elms
*Assistant Examiner*—Beth E. Owens
(74) *Attorney, Agent, or Firm*—Jones Day

(57) ABSTRACT

A method for reducing microsteps on an epitaxial layer deposited on a polished semiconductor wafer substrate by post-epitaxial thermal oxidation. The method produces very smooth semiconductor wafers by performing the steps of depositing an epitaxial layer on a wafer substrate, oxidizing a top portion of the expitaxial layer, and removing the oxidized top portion. As a result, the wafer's surface presents little or no microsteps thereon.

1 Claim, 1 Drawing Sheet

POST-EPITAXIAL THERMAL OXIDATION FOR REDUCING MICROSTEPS ON POLISHED SEMICONDUCTOR WAFERS

CROSS REFERENCES TO RELATED APPLICATIONS

The present application is a continuation of and claims priority from non-provisional application Ser. No. 10/114,899 filed Apr. 2, 2002 now U.S. Pat. No. 6,482,659 issued Nov. 19, 2002 which is a divisional of application Ser. No. 09/233,253 filed Jan. 19, 1999 now U.S. Pat. No. 6,372,521 issued Apr. 16, 2002 which claims benefit of provisional U.S. Patent Application No. 60/072,046 filed on Jan. 21, 1998.

TECHNICAL FIELD

This invention relates generally to semiconductor wafer production.

BACKGROUND OF THE INVENTION

In general, semiconductor wafers are prepared in several steps, including (1) growing a single crystal ingot out of molten silicon, (2) sawing the single crystal ingot into wafers, (3) shaping or lapping the wafers, (4) performing a rough polish, and (5) depositing an epilayer of silicon substrate. The epilayer is often deposited using chemical vapor, high temperature deposition to form a single crystal silicon layer on the surface of the wafer. Once the wafers have been prepared, they are provided to a fabrication facility (fab) for further processing.

As fabs are processing smaller and smaller line widths and devices are continually shrinking, the wafer surface affects the entire fab processing. Furthermore, a particle that was once "invisible" can now completely ruin a device. Also, the surface of an epitaxial wafer exhibits characteristics known as "microsteps." Microsteps occur because the surface of the wafer is crystalline and when it is sawed, the surface is disoriented with respect to the crystallographic planes. Therefore, despite the wafers being sawn and polished, the resulting surface has these microsteps across its surface.

SUMMARY OF THE INVENTION

In response to the problems discussed above, described herein is a system and method for handling post-epitaxial thermal oxidation. In one embodiment, the method produces semiconductor wafers by performing the steps of forming a wafer substrate, depositing an epilayer on the substrate, oxidizing a top portion of the epilayer, and removing the oxidized top portion. As a result, the wafer includes an epi-surface that is very smooth, with little or no microsteps thereon.

DESCRIPTION OF THE PREFERRED EMBODIMENT

Figure 1A:
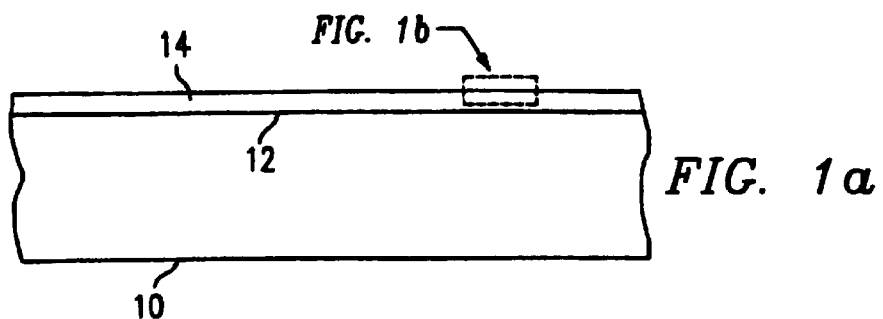
FIGS. 1a, 1b are cross-sectional views of a wafer with an epitaxial layer deposited thereon.
Figure 1B:
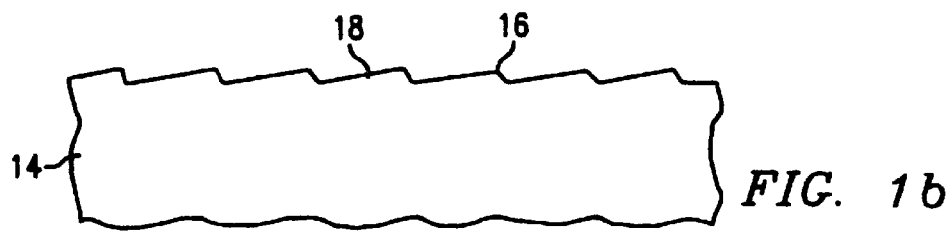

Referring to FIG. 1a, a semiconductor wafer substrate 10 has deposited on its top surface 12 an epitaxial layer 14. Fabricating an epitaxial layer on a wafer is well known in the art and will not be further discussed. However, referring to FIG. 1b, it becomes evident that small micro steps 16 are formed on a top surface 18 of epilayer 14.

Figure 2:
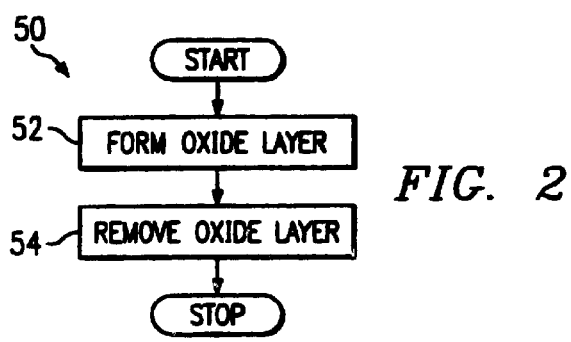
FIG. 2 is a flowchart of a method to be performed on the wafer of FIG. 1.
Figure 3:
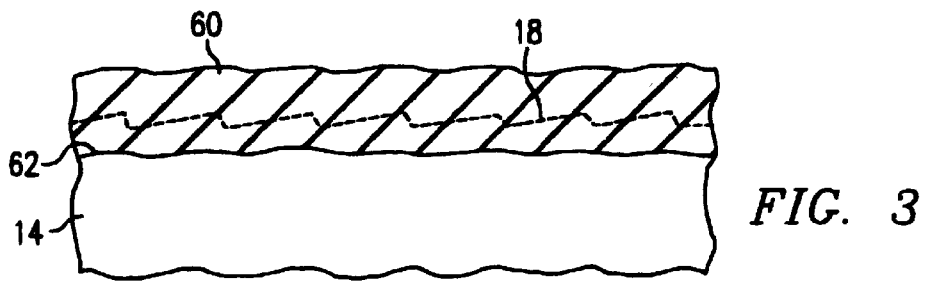
FIG. 3 is a cross-sectional view of the wafer of FIGS. 1a, 1b with an oxide layer on a top surface thereof.

Referring to FIGS. 2 and 3, a method 50 is used to reduce the size of microsteps 16 (as well as remove any particles) from the top surface 18 of epilayer 14. At step 52, oxidation layer 60 is deposited or grown on epilayer 14 using thermal oxidation. During this step 52, a portion of the epilayer (silicon) is consumed by the oxygen. As a result, the previous epi-surface 18 no longer exists and a new, smoother epi/oxide interface 62 is formed. At step 54, oxide layer 60, including the consumed silicon that previously existed between epi-surface 18 and epi/oxide interface 62, is removed.

Figure 4:
FIG. 4 is a cross-sectional view of the wafer of FIG. 2 after the oxide layer has been removed.

Referring to FIG. 4, as a result, a resultant epi-surface 64 is formed on the epilayer 14. The epi-surface 64 is relatively smooth, as compared with the epi-surface 18.

What is claimed is:

1. A method for reducing the size of microsteps on an epitaxial layer deposited on a polished semiconductor wafer substrate, the method comprising:

providing a semiconductor wafer;

depositing an epitaxial layer on a surface of said semiconductor wafer, wherein during the deposition of the epitaxial layer microsteps are formed on an exposed surface of said epitaxial layer;

oxidizing at least a portion of the epitaxial layer of said semiconductor to a subsurface depth below said microsteps on said exposed surface of said epitaxial layer; and removing said microsteps by substantially removing the oxidized portion of said epitaxial layer to the subsurface depth below said microsetps on said exposed surface of said epitaxial layer.

\* \* \* \* \*